United States Patent
Ojima et al.

(10) Patent No.: US 9,476,773 B2
(45) Date of Patent: Oct. 25, 2016

(54) COMPOSITE SENSOR AND COMPOSITE SENSOR MODULE HAVING FIRST AND SECOND SUBSTRATES MOUNTED TO FORM A SEAL BODY ABOUT A THERMAL IMAGE SENSOR WITH A RANGE IMAGE SENSOR ARRANGED WITH THE SECOND SUBSTRATE

(71) Applicant: HAMAMATSU PHOTONICS K.K., Hamamatsu-shi, Shizuoka (JP)

(72) Inventors: Fumikazu Ojima, Hamamatsu (JP); Mitsuhito Mase, Hamamatsu (JP); Naoto Sakurai, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 79 days.

(21) Appl. No.: 14/415,868

(22) PCT Filed: Apr. 16, 2013

(86) PCT No.: PCT/JP2013/061296
§ 371 (c)(1),
(2) Date: Jan. 20, 2015

(87) PCT Pub. No.: WO2014/020950
PCT Pub. Date: Feb. 6, 2014

(65) Prior Publication Data
US 2015/0211935 A1 Jul. 30, 2015

(30) Foreign Application Priority Data
Aug. 1, 2012 (JP) ................................ 2012-171340

(51) Int. Cl.
*G01J 5/12* (2006.01)
*H04N 5/33* (2006.01)
(Continued)

(52) U.S. Cl.
CPC . *G01J 5/12* (2013.01); *G01C 3/02* (2013.01); *G01J 1/0407* (2013.01); *G01J 3/36* (2013.01);
(Continued)

(58) Field of Classification Search
CPC ....... G01J 1/04; G01J 2005/123; G01J 5/025; G01J 5/045; G01J 5/12; G01C 3/02
USPC .................. 250/214.1, 221, 238, 239, 208.1, 250/338.1–339.04; 340/555–557
See application file for complete search history.

(56) References Cited

U.S. PATENT DOCUMENTS

| | | | |
|---|---|---|---|
| 8,502,149 B2 * | 8/2013 | Tsuchiya | G01J 5/0225 250/338.3 |
| 2009/0301542 A1 | 12/2009 | Ojima et al. | |

(Continued)

FOREIGN PATENT DOCUMENTS

| | | |
|---|---|---|
| JP | H11-214668 | 8/1999 |
| JP | 2001-318165 A | 11/2001 |

(Continued)

OTHER PUBLICATIONS

English-language translation of International Preliminary Report on Patentability (IPRP) dated Feb. 12, 2015 that issued in WO Patent Application No. PCT/JP2013/061296.

*Primary Examiner* — Que T Le
(74) *Attorney, Agent, or Firm* — Drinker Biddle & Reath LLP

(57) ABSTRACT

In a composite sensor, an arrangement region of thermal image sensors and an arrangement region of range image sensors are arranged so as to overlap each other as seen in the mounting direction. This makes it possible to acquire thermal and range images coaxially, thereby suppressing image misalignment between the thermal and range images. In the composite sensor, a seal body formed by mounting the first and second substrates on top of each other seals a space about the thermal image sensors in a vacuum state. This can prevent the heat occurring about the range image sensors from affecting the thermal image sensor side. In addition, the substrate arranged with the thermal image sensors and the substrate arranged with the range image sensors are separate from each other, which can secure a degree of freedom in designing.

5 Claims, 9 Drawing Sheets

(51) Int. Cl.
*G01J 5/04* (2006.01)
*G01J 5/02* (2006.01)
*G01C 3/02* (2006.01)
*G01J 1/04* (2006.01)
*G01S 17/02* (2006.01)
*G01S 7/481* (2006.01)
*H04N 5/374* (2011.01)
*G01J 5/08* (2006.01)
*G01J 3/36* (2006.01)
*H01L 27/146* (2006.01)

(52) U.S. Cl.
CPC .............. *G01J 5/0275* (2013.01); *G01J 5/045* (2013.01); *G01J 5/0859* (2013.01); *G01S 7/4816* (2013.01); *G01S 17/023* (2013.01); *H04N 5/33* (2013.01); *H04N 5/374* (2013.01); *G01J 2005/123* (2013.01); *H01L 27/14649* (2013.01); *H01L 2224/48091* (2013.01)

(56) References Cited

U.S. PATENT DOCUMENTS

| | | |
|---|---|---|
| 2012/0181650 A1 | 7/2012 | Mase et al. |
| 2012/0307232 A1 | 12/2012 | Mase et al. |

FOREIGN PATENT DOCUMENTS

| | | |
|---|---|---|
| JP | 2009-014459 A | 1/2009 |
| JP | 2011-514709 A | 5/2011 |
| JP | 2011-232606 A | 11/2011 |
| TW | 200943543 | 10/2009 |
| TW | 201215856 | 4/2012 |
| WO | WO 2007/086421 | 8/2007 |
| WO | WO-2007/086424 A1 | 8/2007 |

\* cited by examiner

COMPOSITE SENSOR AND COMPOSITE SENSOR MODULE HAVING FIRST AND SECOND SUBSTRATES MOUNTED TO FORM A SEAL BODY ABOUT A THERMAL IMAGE SENSOR WITH A RANGE IMAGE SENSOR ARRANGED WITH THE SECOND SUBSTRATE

TECHNICAL FIELD

The present invention relates to a composite sensor and a composite sensor module.

BACKGROUND ART

Sensors having motion-detecting functions for sensing entries of people and the like have conventionally been known. While such a sensor is required to have a sufficient detection accuracy, using a thermal image sensor such as a thermopile or a bolometer array alone may fail to distinguish a remote adult and a nearby child from each other, for example. Hence, for example, techniques set forth in Patent Literatures 1 to 3 propose composite sensors each combining a thermal image sensor and a range image sensor together.

CITATION LIST

Patent Literature

Patent Literature 1: Japanese Patent Application Laid-Open No. 2001-318165
Patent Literature 2: Japanese Translated International Application Laid-Open No. 2011-514709
Patent Literature 3: Japanese Patent Application Laid-Open No. 2011-232606

SUMMARY OF INVENTION

Technical Problem

For accurately detecting an object to be detected, the above-mentioned composite sensors are required to suppress image misalignment between the thermal and range images. It is also necessary for them to eliminate influences of external disturbances, so as to improve sensitivities of the thermal and range image sensors. Further, in connection with arranging the thermal and range image sensors, there are demands for carrying out manufacturing methods optimal for the respective sensors and securing such a degree of freedom as to allow designing for arranging a signal readout circuit and the like.

For solving the problems mentioned above, it is an object of the present invention to provide a composite sensor which can fully improve the sensitivity of the sensor, while securing a degree of freedom in manufacture and arrangement.

Solution to Problem

For solving the above-mentioned problems, the composite sensor in accordance with the present invention comprises a first substrate arranged with a thermal image sensor constituted by a plurality of thermoelectric elements; and a second substrate arranged with a range image sensor having a charge generation region for generating an electric charge in response to light incident thereon and a transfer electrode for transferring the electric charge generated in the charge generation region to a predetermined charge collection region according to a charge transfer signal given beforehand; the second substrate being mounted on the first substrate such that a region arranged with the thermal image sensor and a region arranged with the range image sensor overlap each other as seen in the mounting direction; the first and second substrates being mounted on top of each other so as to form a seal body sealing a space about the thermal image sensor with the first substrate serving as a top plate.

In this composite sensor, a region arranged with the thermal image sensor and a region arranged with the range image sensor are arranged such as to overlap each other as seen in the mounting direction. This makes it possible to acquire thermal and range images coaxially, thereby suppressing image misalignment between the thermal and range images. Hence, an object to be detected can be detected accurately. It also reduces the time required for calculations and improves time resolution. In this composite sensor, the seal body formed by mounting the first and second substrates on top of each other seals the space about the thermal image sensor. This can prevent the heat occurring about the range image sensor from affecting the thermal image sensor side, thereby improving the sensitivity of the thermal image sensor. In addition, the substrate arranged with the thermal image sensor and the substrate arranged with the range image sensor are separate from each other, which makes it possible to perform manufacturing methods optimal for the sensors and secure a degree of freedom in designing for arranging a signal readout circuit and the like.

Preferably, the range image sensor in the second substrate has an arrangement pitch smaller than that of the thermal image sensor in the first substrate. The range image sensor includes constituents such as the transfer electrode, and these constituents may become a shield which covers the thermal image sensor. Therefore, when the arrangement pitch of the range image sensor is on a par with or greater than that of the thermal image sensor, the influence of shield per pixel of the thermal image sensor may be so large that thermal image deteriorates its quality. Hence, making the range image sensor arrangement pitch smaller than the thermal image sensor arrangement pitch can suppress the influence of shield per pixel of the thermal image sensor, thereby securing the thermal image quality.

Preferably, an optical filter film transparent to light in a mid-infrared region is formed on an inner wall surface of the seal body. This can cut off light in a wavelength band which is susceptible to the absorption by moisture, carbon dioxide, and the like in air, thereby enabling the thermal image sensor to further improve its sensitivity.

Preferably, the seal body has a vacuum state therewithin. This can more securely prevent the heat occurring about the range image sensor from affecting the thermal image sensor side.

The composite sensor module in accordance with the present invention comprises the above-mentioned composite sensor and a lens arranged such as to have an imaging plane at the region arranged with the range image sensor in the second substrate.

In this composite sensor module, a region arranged with the thermal image sensor and a region arranged with the range image sensor are arranged such as to overlap each other as seen in the mounting direction in the composite sensor. This makes it possible to acquire thermal and range images coaxially, so as to suppress image misalignment between the thermal and range images, whereby an object to be detected can be detected accurately. It also reduces the time required for calculations and improves time resolution.

In this composite sensor module, the seal body formed by mounting the first and second substrates on top of each other seals the space about the thermal image sensor. This can prevent the heat occurring about the range image sensor from affecting the thermal image sensor side, thereby improving the sensitivity of the thermal image sensor. In addition, the substrate arranged with the thermal image sensor and the substrate arranged with the range image sensor are separate from each other, which makes it possible to perform manufacturing methods optimal for the sensors and secure a degree of freedom in designing for arranging a signal readout circuit and the like.

Advantageous Effects of Invention

The present invention can fully improve the sensitivity of the sensor and secure a degree of freedom in manufacture and arrangement.

DESCRIPTION OF EMBODIMENTS

In the following, preferred embodiments of the composite sensor and composite sensor module in accordance with the present invention will be explained in detail with reference to the drawings.

First Embodiment

Figure 1:
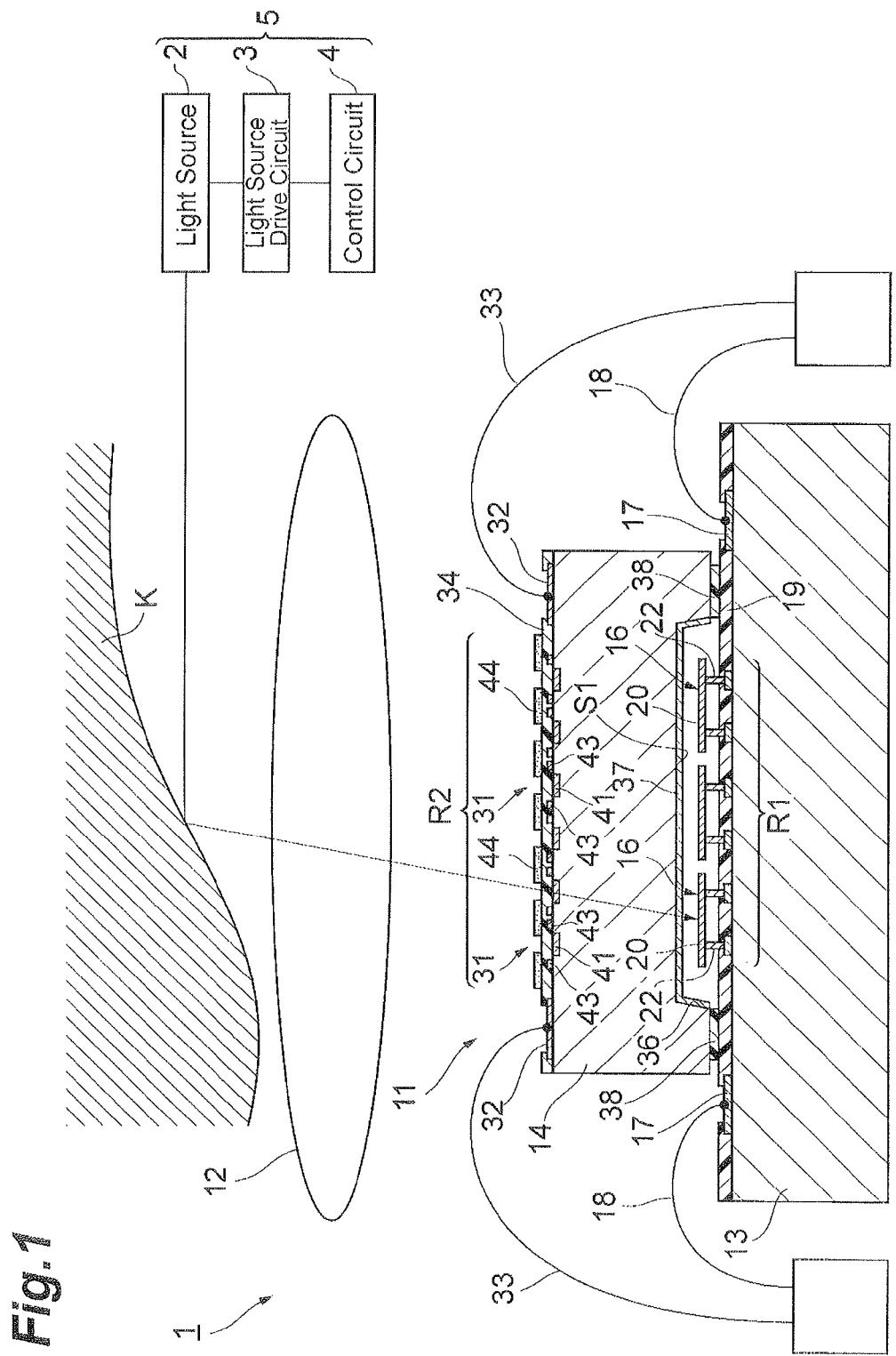
FIG. 1 is a sectional view illustrating the composite sensor module in accordance with a first embodiment of the present invention.

FIG. 1 is a sectional view illustrating the composite sensor module in accordance with a first embodiment of the present invention. As depicted, this composite sensor module 1 comprises a composite sensor 11 and a lens 12. The composite sensor module 1 is a module used as a motion sensor which detects entries of people into a predetermined area and the like according to thermal and range images.

Connected to the composite sensor module 1 in use is a light source unit 5 including a light source 2 such as a laser or a light-emitting diode, for example, a light source drive circuit 3 for driving the light source 2 at a high frequency, and a control circuit 4 for outputting a driving clock for the light source drive circuit 3. The light source 2 emits a modulated wave subjected to light intensity modulation in the form of a square wave or sine wave. The modulated wave is reflected by a surface of an object to be detected K and enters the composite sensor 11 through the lens 12. Preferably, the light emitted from the light source 2 is not visible light, but falls in a wavelength band where a sufficient sensitivity for Si is obtained; for example, near infrared light having a wavelength of about 800 nm is chosen. The modulated signal (charge transfer signal) in the form of the square wave or sine wave in synchronization with the driving clock from the control circuit 4 is fed to transfer electrodes 43, 43 of a range image sensor 31, which will be explained later, in respective phases on the reverse of each other.

The lens 12, which is an imaging lens made of ZnSe, for example, is arranged such as to have an imaging plane at an arrangement region R2 of range image sensors 31, which will be explained later. For example, light in a wavelength band of 0.5 μm to 28.1 μm passes through the lens 12, so as to enter the composite sensor 11. Not only ZnSe, but ZnS, $As_2S_3$, and the like may also be used as a material for the lens 12.

The composite sensor 11 will now be explained.

Figure 2:
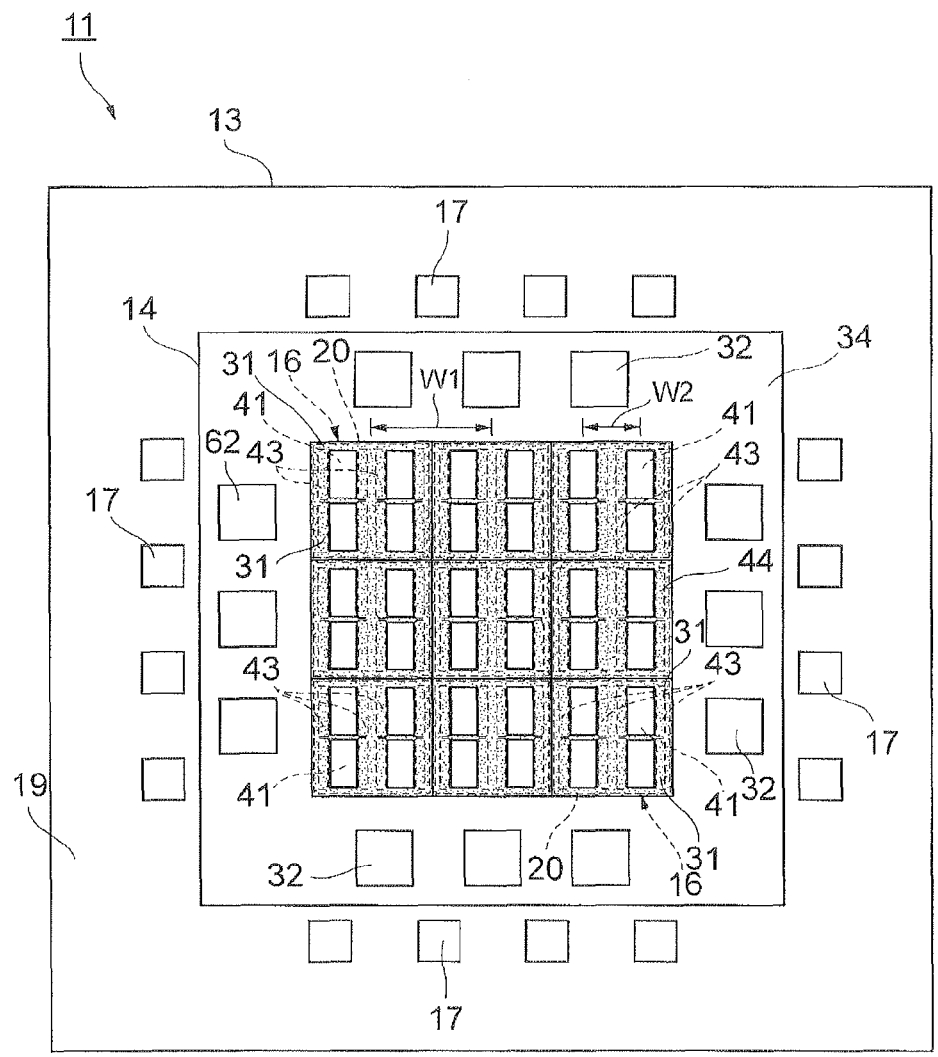
FIG. 2 is a plan view of a composite sensor.

As illustrated in FIGS. 1 and 2, the composite sensor 11 comprises a first substrate 13 on which thermal image sensors 16 are arranged in a matrix and a second substrate 14, slightly smaller than the first substrate 13, on which range image sensors 31 are arranged in a matrix. Each of the first and second substrates 13, 14 is formed of Si by a thickness of about 30 μm, so that light in a wavelength band of 1.2 μM to 28.1 μm, for example, passes therethrough.

An arrangement region R1 of the thermal image sensors 16 is set into a substantially square form on one side of the first substrate 13. On the outside of the arrangement region R1, electrode pads 17 for the thermal image sensors 16 are arranged so as to surround the arrangement region R1. Wires 18 electrically connect the electrode pads 18 to wiring circuits on the package side. Except for the locations formed with the electrode pads 17, the one side of the first substrate 13 is covered with an insulating film 19 made of $SiO_2$, for example.

Figure 3:
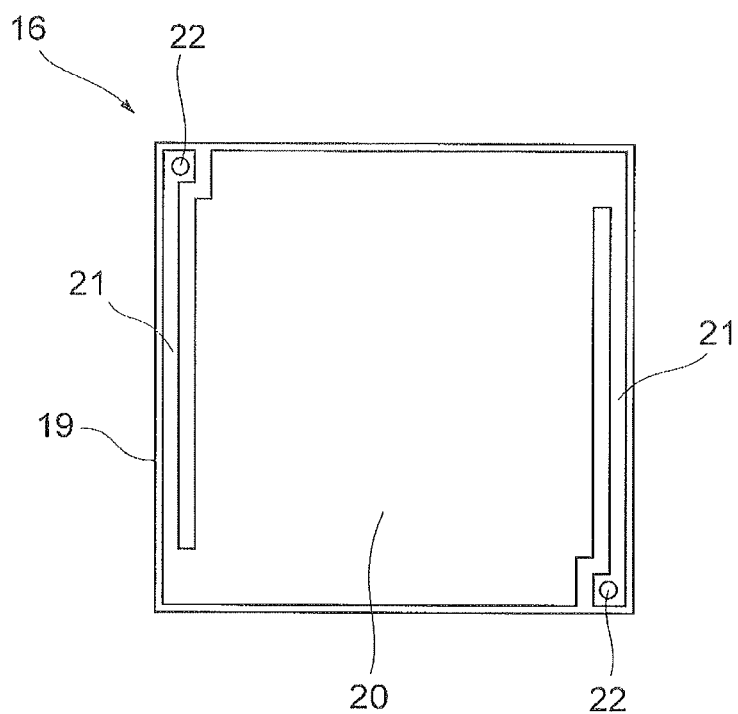
FIG. 3 is a plan view of a thermal image sensor.

Each of the thermal image sensors 16 arranged on the first substrate 13 is a wavelength-independent sensor such as a thermopile or bolometer, for example, and has a plurality of thermoelectric elements. As illustrated in FIG. 3, each pixel of the thermal image sensor 16 has a substantially rectangular light-receiving part 20, joints 21, 21 extending from two opposing corners of the light-receiving part 20 in respective directions opposite from each other along sides of the light-receiving part 20, and support columns 22, 22 disposed at respective leading end parts of the joints 21, 21.

Consequently, as illustrated in FIG. 1, the light-receiving parts 20 are raised from one side of the first substrate 13 while being slightly separated from the insulating film 19. As illustrated in FIG. 2, the thermal image sensors 16, 16 adjacent to each other have therebetween an arrangement pitch (distance between the centers of the light-receiving parts 20) W1 of about 60 μm, for example. A light-reflecting layer made of Al or the like may be disposed on the insulating film 19 so as to correspond to the region formed with the light-receiving parts 20. In this case, the light-reflecting layer can make leak light incident on the light-receiving parts 20, thereby further improving the sensitivity of the thermal image sensors 16.

On one side of the second substrate 14, on the other hand, the arrangement region R2 of the thermal image sensors 31 is set into a substantially square form with a size on a par with the arrangement region R1 of the thermal image sensors 16, for example, as illustrated in FIG. 1. On the outside of the arrangement region R2, the electrode pads 32 for the range image sensors 31 are arranged so as to surround the arrangement region R2 at positions on the inside of the electrode pads 32 for the thermal image sensors 31 in planar view. As with the electrode pads 17, the electrode pads 32 are electrically connected to wiring circuits on the package side with wires 33. Except for the locations formed with the electrode pads 32, the one side of the second substrate 14 is covered with an insulating film 34 made of $SiO_2$, for example.

The other side of the second substrate 14 is formed with a depression 36 having a substantially square cross section with a size corresponding to the arrangement region R1 of the thermal image sensors 16 by anisotropic etching or dry etching of Si, for example. The inner wall surface of the depression 36 is provided with an optical filter film 37 transparent to light in a mid-infrared region. More specifically, the optical filter film 37 is constituted by a multilayer film of Ge and ZnS, for example, so as to transmit therethrough only light in a band on the order of 8 μm to 14 μm. On the other side of the second substrate 14, fringe parts of the depression 36 are provided with an insulating film 38 made of $SiO_2$, for example.

The foregoing second substrate 14 is mounted on the first substrate 13 such that the depression 36 faces the first substrate 36, while the arrangement region R1 of the thermal image sensors 16 and the arrangement region R2 of the range image sensors 31 overlap each other as seen in the mounting direction. Mounting the second substrate 14 causes the inner wall surface of the depression 36 and one side of the first substrate 13 to form a seal body S1 which seals a space about the thermal image sensors 16 with the first substrate 13 serving as a top plate. For mounting the first and second substrates 13, 14 on top of each other, room temperature bonding in a vacuum atmosphere is used, for example. Therefore, the inner space of the seal body S1 containing the thermal image sensors 16 is in a vacuum state.

Figure 4:
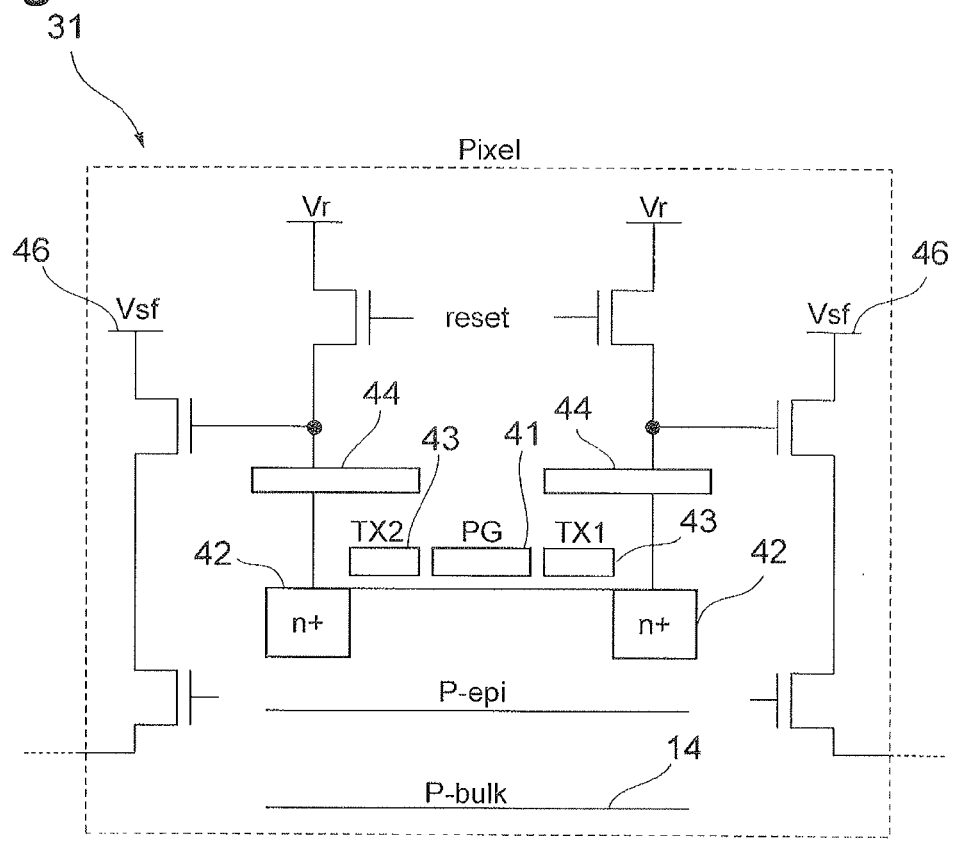
FIG. 4 is a circuit diagram of a range image sensor.

The range image sensors 31 arranged on the second substrate 14 are so-called charge distribution type range image sensors. As illustrated in FIG. 4, each pixel of the range image sensors 31 has a light-receiving part (charge generation region) 41 for generating an electric charge in response to light incident thereon and a pair of transfer electrodes 43, 43 for transferring the electric charge generated in the light-receiving part 41 to charge collection regions 42, 42 according to a charge transfer signal given beforehand.

The light-receiving parts 41, which are parts where the light transmitted through the lens 12 is incident, are arranged 2×2 for each light-receiving part 20 of the thermal image sensors 16 as illustrated in FIG. 2. As a consequence, the range image sensors 31, 31 adjacent to each other have therebetween an arrangement pitch (distance between the centers of the light-receiving parts 41) W2 which is ½ or less of the above-mentioned arrangement pitch W1 between the thermal image sensors 16, 16. In the arrangement region R2, the part excluding the light-receiving parts 41 is formed with a light-shielding part 44 made of Al, for example. The light-shielding part 44 is formed on the insulating film 34 such as to open at the portion corresponding to the light-receiving parts 41, so that the ratio of the opening portion to the light-shielding part 44 is on the order of 20% to 50%, for example.

As illustrated in FIG. 4, the charge collection regions 42, 42 are a pair of high-concentration n-type semiconductor regions further formed on the surface side of a p-type semiconductor region formed with a low concentration on the surface side of a high-concentration p-type semiconductor region. The n-type semiconductor regions have electrons as carriers in an electrically neutral state and will positively be ionized if the carriers drop out. Hence, the charge collection regions 42, 42 will greatly be depressed downward, thereby constructing a potential well. Source follower amplifiers 46, 46 are electrically connected to the charge collection regions 42, 42, respectively.

The transfer electrodes 43, 43 are arranged between the light-receiving part 41 and the charge collection regions 42, 42. The modulated signal (charge transfer signal) in the form of the square wave or sine wave in synchronization with the driving clock from the control circuit 4 is fed to the transfer electrodes 43, 43 in respective phases on the reverse of each other. A region having a potential lower than that of the light-receiving part 41 is formed directly under the transfer electrode 43 fed with the high-level modulated signal. As a consequence, the electrons generated in the light-receiving part 41 are transferred by the transfer electrode 43, so as to be distributed and stored into its corresponding charge collection region 42.

The electric charges stored in the charge collection regions 42, 42 are fed through an amplification circuit and the like to the control circuit 4 as outputs from the source follower amplifiers 46, 46. According to the outputs from the source follower amplifiers 46, 46, the control circuit 4 calculates a distance, for example, by $L=(\frac{1}{2}) \times c \times [Q_2/(Q_1+Q_2)] \times T_0$, where c is the velocity of light, $Q_1$ is the output signal on the transfer electrode $V_{TX1}$ side (output signal with a phase of 0°), $Q_2$ is the output signal on the transfer electrode $V_{TX2}$ side (output signal with a phase of 180°), and $T_0$ is the pulse width.

Steps of manufacturing the composite sensor 11 will now be explained.

Figure 5:
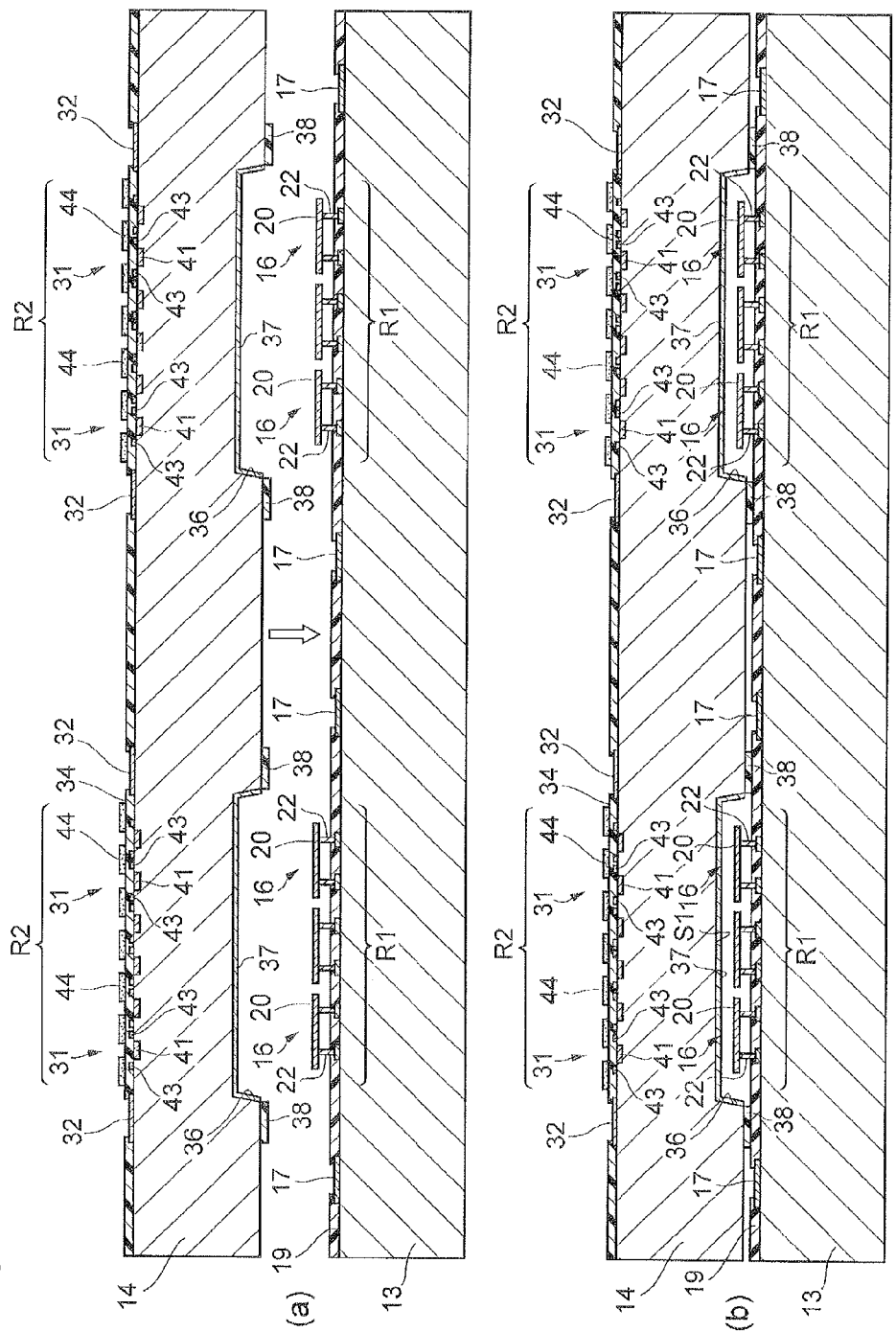
FIG. 5 is a set of diagrams illustrating steps of manufacturing the composite sensor depicted in FIG. 1.

For manufacturing the composite sensor 11, the first and second substrates 13, 14 are prepared separately from each other as illustrated in FIG. 5(a). The electrode pads 17 and insulating film 19 are formed beforehand as a pattern on the first substrate 13, and the thermal image sensors 16 are arranged in the arrangement region R1. The second substrate 14 is formed with the depression 36 by anisotropic etching or dry etching of Si, and then the optical filter film 37 is formed on the inner wall surface of the depression 36 by vapor deposition and the like. Thereafter, individual constituents of the electrode pads 32, insulating films 34, 38, light-shielding part 44, and range image sensors 31 are formed as a pattern.

Subsequently, as illustrated in FIG. 5(b), the second substrate 14 is mounted on the first substrate 13 by room temperature bonding such that the depression 36 faces the first substrate 13, while the arrangement region R1 of the thermal image sensors 16 and the arrangement region R2 of the range image sensors 31 overlap each other as seen in the mounting direction. This forms the seal body S1 sealing a space about the thermal image sensors 16 with the first substrate 13 serving as a top plate. Joining the second substrate 14 to the first substrate 13 at room temperature in a vacuum atmosphere can make the seal body S1 have a vacuum state therewithin.

Figure 6:
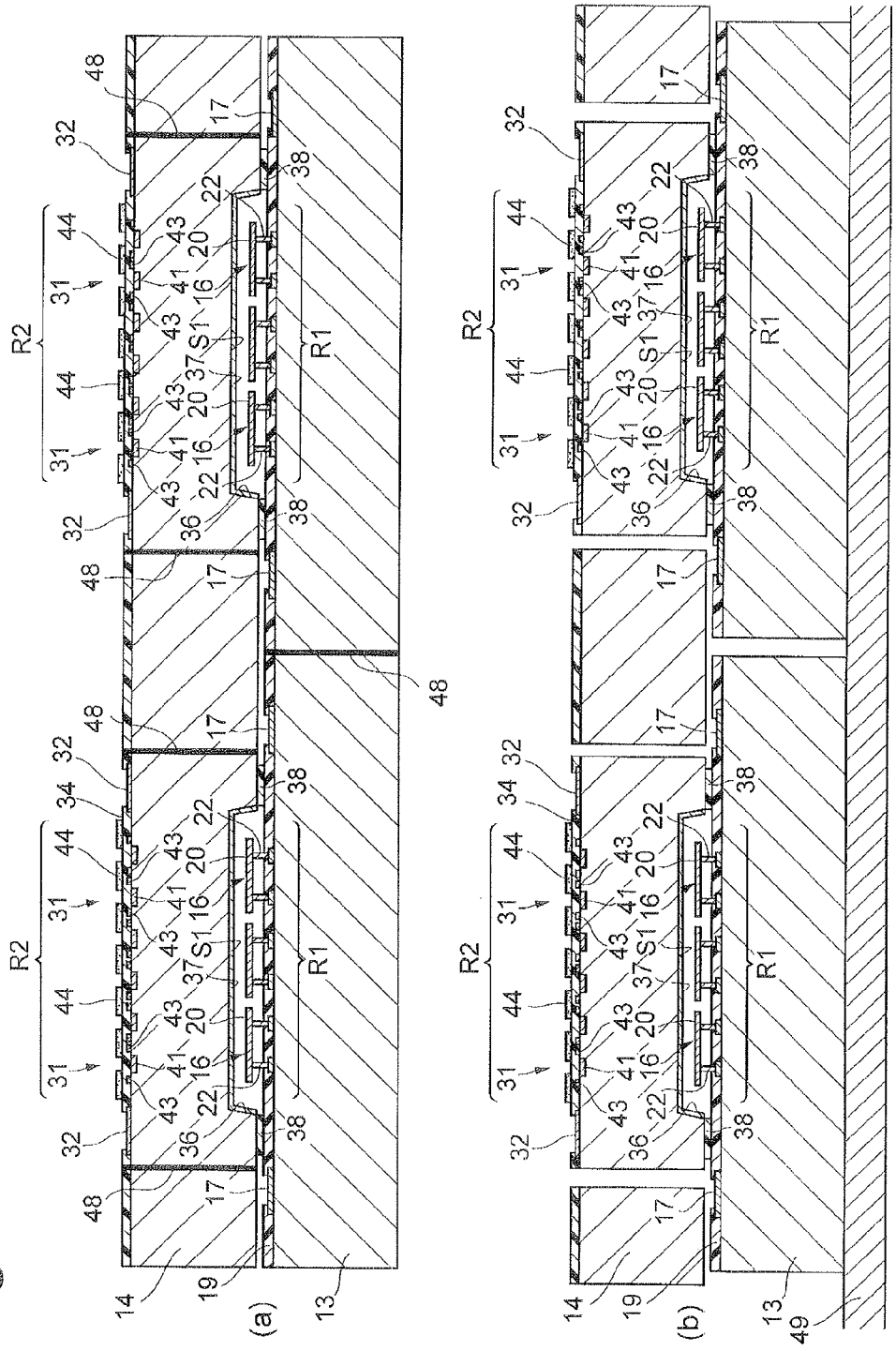
FIG. 6 is a set of diagrams illustrating steps subsequent to FIG. 5.

After mounting the second substrate 14 on the first substrate 13, the first and second substrates 13, 14 are irradiated with laser light along predetermined lines to cut as illustrated in FIG. 6(a), so as to form modified layers 48 therewithin. From the viewpoint of workability, it is preferred for the first substrate 13 to be formed with the modified layers 48 before the second substrate 14.

After forming the modified layers 48, an expandable sheet 49 is attached to the other side of the second substrate 14, for example. Then, the expandable sheet 49 is expanded in its in-plane directions, so as to cut the first and second substrates 13, 14 along the modified layers 48 as illustrated in FIG. 6(b). This separates the individual devices of the composite sensors 11 from each other, thereby yielding the composite sensor 11 illustrated in FIG. 1.

In this composite sensor 11, as explained in the foregoing, the arrangement region R1 of the thermal image sensors 16 and the arrangement region R2 of the range image sensors 31 are arranged so as to overlap each other as seen in the mounting direction. This makes it possible to acquire thermal and range images coaxially, thereby suppressing image misalignment between the thermal and range images. Hence, an object to be detected can be detected accurately. It also reduces the time required for calculations and improves time resolution.

In this composite sensor 11, the seal body S1 formed by mounting the first and second substrates 13, 14 on top of each other seals a space about the thermal image sensors 16 in a vacuum state. This can prevent the heat occurring about the range image sensors 31 from affecting the thermal image sensor 16 side, thereby improving the sensitivity of the thermal image sensors 16. In addition, the substrate arranged with the thermal image sensors 16 and the substrate arranged with the range image sensors 31 are separate from each other, which makes it possible to perform manufacturing methods optimal for the sensors and secure a degree of freedom in designing for arranging a signal readout circuit and the like.

In the composite sensor 11, the arrangement pitch W2 of the range image sensors 31 in the second substrate 14 is smaller than the arrangement pitch W1 of the thermal image sensors 16 in the first substrate 13. The range image sensors 31 include constituents such as the transfer electrodes 43, and these constituents may become a shield which covers the thermal image sensors 16. Therefore, when the arrangement pitch W2 of the range image sensors 31 is on a par with or greater than the arrangement pitch W1 of the thermal image sensors 16, the influence of shield per pixel of the thermal image sensors 16 may be so large that thermal images deteriorate their quality. Hence, making the arrangement pitch W2 of the range image sensors 31 smaller than the arrangement pitch W1 of the thermal image sensors 16 can suppress the influence of shield per pixel of the thermal image sensors 16, thereby securing the thermal image quality.

In the composite sensor 11, the optical filter film 37 transparent to light in a mid-infrared region is formed on an inner wall surface of the seal body S1. This can cut off light in a wavelength band which is susceptible to the absorption by moisture, carbon dioxide, and the like in air, thereby enabling the thermal image sensors 16 to further improve their sensitivity.

Second Embodiment

Figure 7:
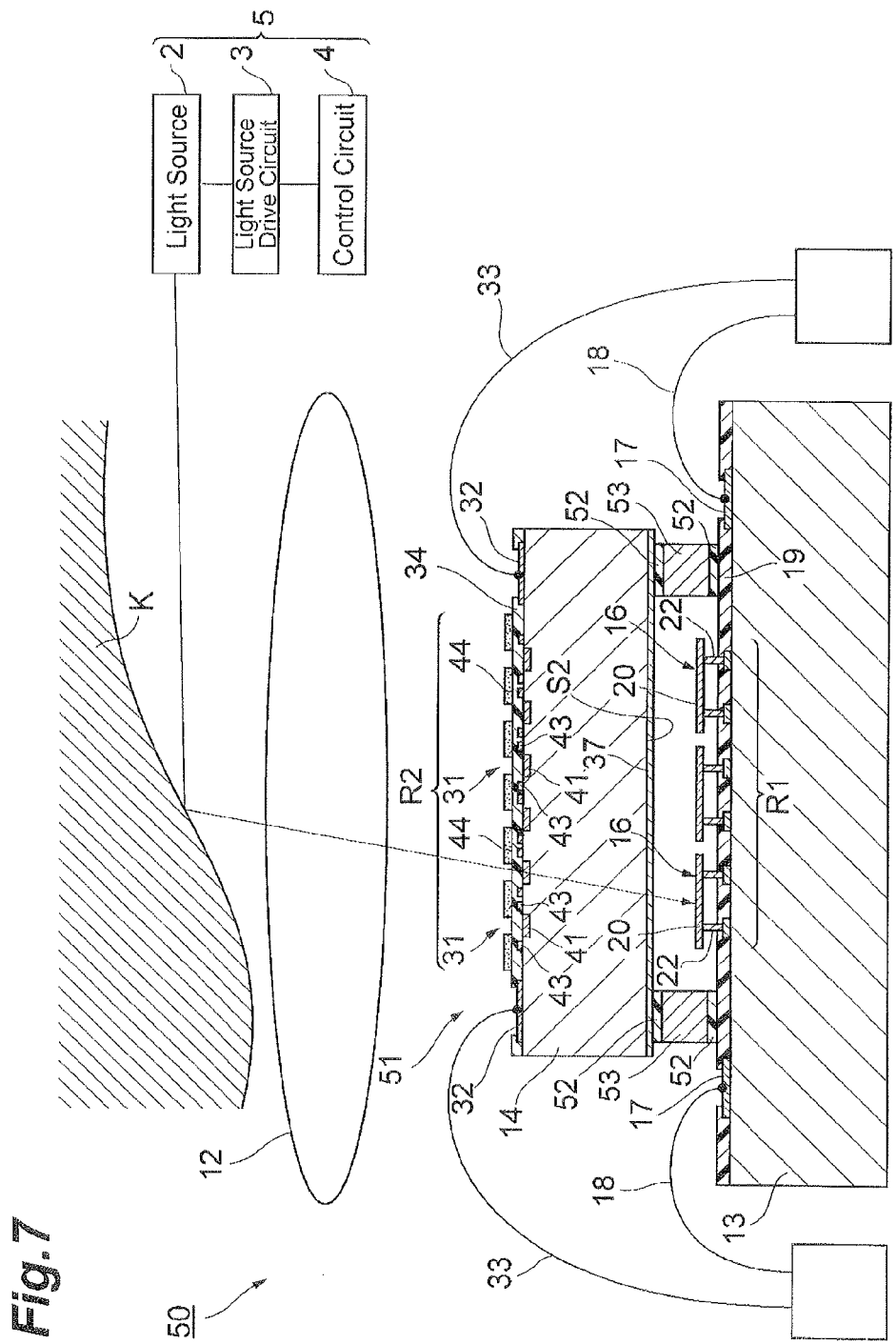
FIG. 7 is a sectional view illustrating the composite sensor module in accordance with a second embodiment of the present invention.

FIG. 7 is a sectional view illustrating a composite sensor module 50 in accordance with a second embodiment of the present invention. As depicted, the composite sensor module 50 in accordance with the second embodiment differs from the first embodiment in the joint structure between the first and second substrates 13, 14 in the composite sensor 51.

More specifically, the composite sensor 51 has no depression 36 on the other side of the second substrate 14, so that the second substrate 14 has a flat surface on the other side. The optical filter film 37 is formed all over the surface on the other side of the second substrate 14. For joining the first and second substrates 13, 14 together, foil materials 52 and a lid material 53 are used. The foil materials 52, each of which is a layer combining a buffer metal with a low-melting metal, are made of Ti/Pt/Au or Cr/Ni/Au, for example. The foil materials 52 are arranged like rings on one side of the first substrate 13 and the other side of the second substrate 14 at positions overlapping the electrode pads 32, for example.

The lid material 53 is a ring-shaped metal material made of Kovar, for example. The lid material 53 is held between and joined to the foil material 52 on the first substrate 13 side and the foil material 52 on the second substrate side. Since the lid material 53 is interposed, a space corresponding to the thickness of the lid material 53 is formed between the first and second substrates 13, 14. One side of the first substrate 13, the other side of the second substrate 14, and the lid material 53 form a seal body S2 sealing a space about the thermal image sensors 16 with the first substrate 13 serving as a top plate. The inner space of the seal body S2 has a vacuum state as in the first embodiment.

Figure 8:
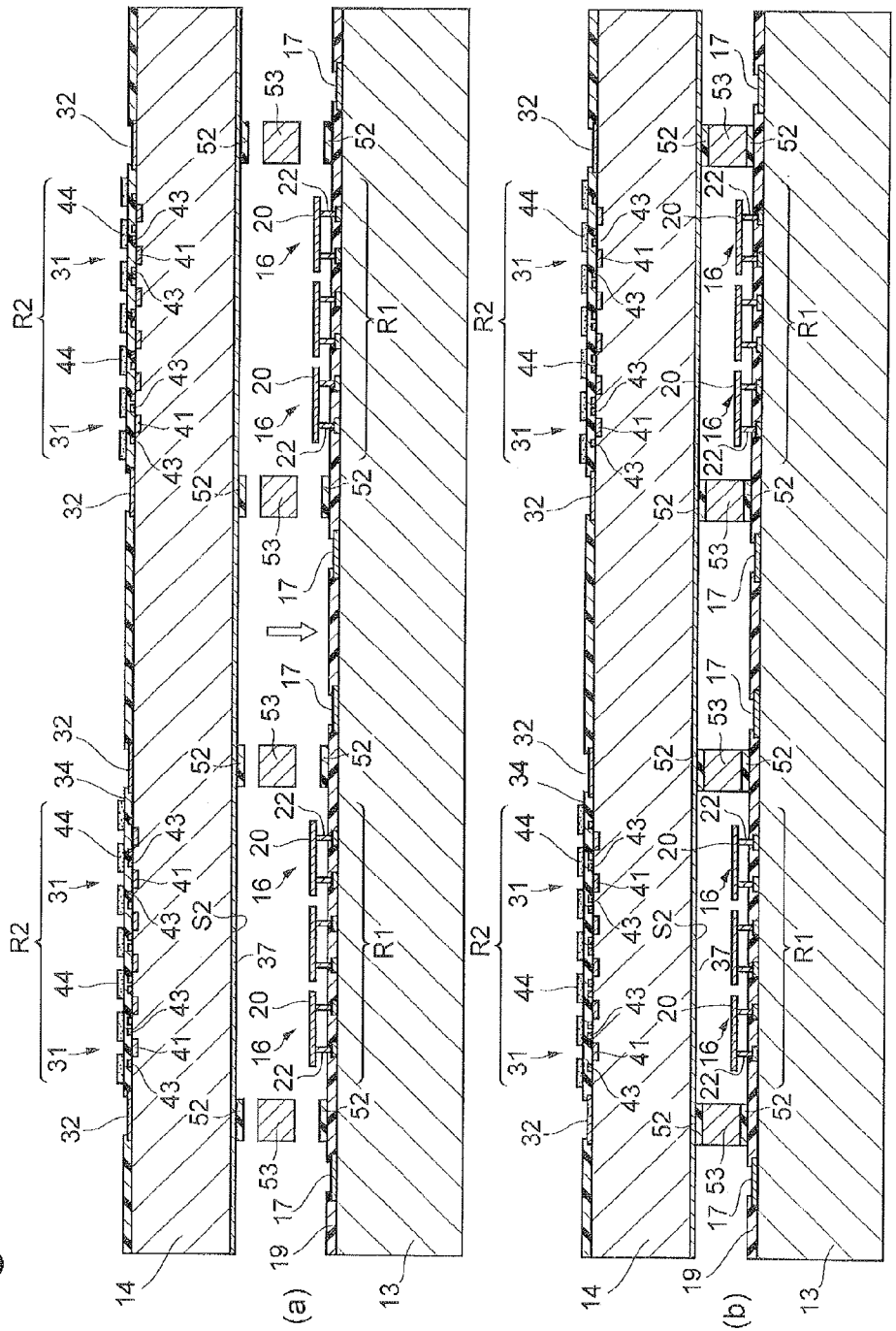
FIG. 8 is a set of diagrams illustrating steps of manufacturing the composite sensor depicted in FIG. 7.

For manufacturing the composite sensor 51, the first and second substrates 13, 14 are prepared separately from each other as illustrated in FIG. 8(a). The electrode pads 17, insulating film 19, and foil material 52 are formed beforehand as a pattern on the first substrate 13, and the thermal image sensors 16 are arranged in the arrangement region R1. The second substrate 14 is formed beforehand with individual constituents of the electrode pads 32, insulating films 34, 38, foil material 52, light-shielding part 44, and range image sensors 31 as a pattern after forming the optical filter film 37 on the other side by vapor deposition, for example.

Subsequently, as illustrated in FIG. 8(b), the lid material 53 is arranged between the foil materials 52, 52 while the arrangement region R1 of the thermal image sensors 16 and the arrangement region R2 of the range image sensors 31 overlap each other as seen in the mounting direction, and the second substrate 14 is mounted on the first substrate 13. This forms the seal body S2 sealing a space about the thermal image sensors 16 with the first substrate 13 serving as a top plate. Joining them in a vacuum atmosphere can place the inner space of the seal body S2 into a vacuum state.

Figure 9:
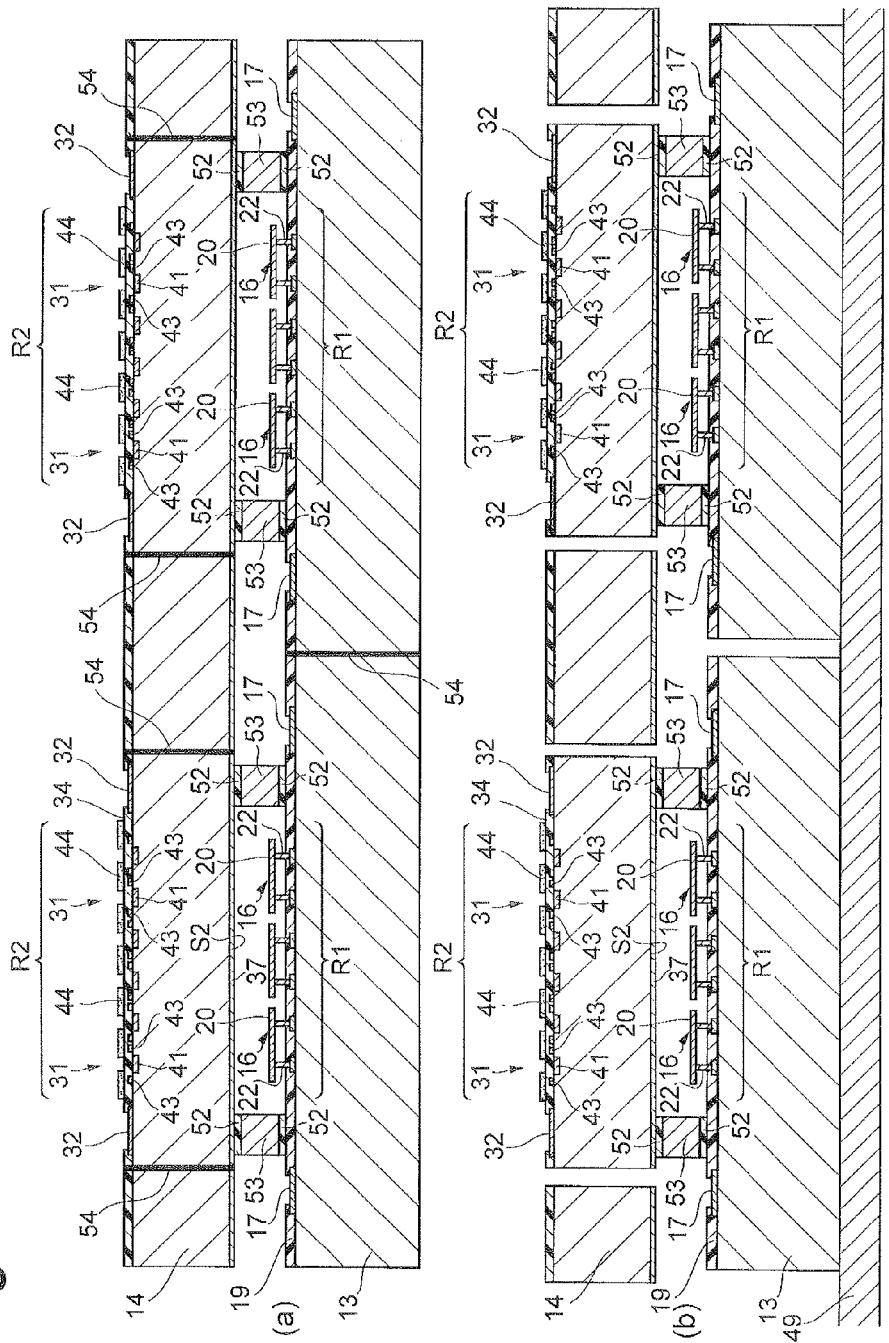
FIG. 9 is a set of diagrams illustrating steps subsequent to FIG. 8.

After mounting the second substrate 14 on the first substrate 13, the first and second substrates 13, 14 are irradiated with laser light along predetermined lines to cut as illustrated in FIG. 9(a), so as to form modified layers 54 therewithin. From the viewpoint of workability, it is preferred for the first substrate 13 to be formed with the modified layers 54 before the second substrate 14.

After forming the modified layers 54, an expandable sheet 49 is attached to the other side of the second substrate 14, for example. Then, the expandable sheet 49 is expanded in its in-plane directions, so as to cut the first and second substrates 13, 14 along the modified layers 54 as illustrated in FIG. 9(b). This separates the individual devices of the composite sensor 51 from each other, thereby yielding the composite sensor 51 illustrated in FIG. 7.

In the foregoing composite sensor 51, the arrangement region R1 of the thermal image sensors 16 and the arrangement region R2 of the range image sensors 31 are also arranged so as to overlap each other as seen in the mounting direction. This makes it possible to acquire thermal and range images coaxially, thereby suppressing image misalignment between the thermal and range images. Hence, an object to be detected can be detected accurately. It also reduces the time required for calculations and improves time resolution.

In this composite sensor 51, the seal body S2 formed by mounting the first and second substrates 13, 14 on top of each other also seals a space about the thermal image sensors 16 in a vacuum state. This can prevent the heat occurring about the range image sensors 31 from affecting the thermal image sensor 16 side, thereby improving the sensitivity of the thermal image sensors 16. In addition, the substrate arranged with the thermal image sensors 16 and the substrate arranged with the range image sensors 31 are separate from each other, which makes it possible to perform manufacturing methods optimal for the sensors and secure a degree of freedom in designing for arranging a signal readout circuit and the like.

In this composite sensor 51, the arrangement pitch W2 of the range image sensors 31 in the second substrate 14 is also smaller than the arrangement pitch W1 of the thermal image sensors 16 in the first substrate 13, This can suppress the influence of shield per pixel of the thermal image sensors 16, thereby securing the thermal image quality, Further, the optical filter film 37 within the seal body S2 can cut off light in a wavelength band which is susceptible to the absorption by moisture, carbon dioxide, and the like in air, thereby enabling the thermal image sensors 16 to further improve their sensitivity.

REFERENCE SIGNS LIST 1, 50: composite sensor module; 11, 51: composite sensor; 12: lens; 13: first substrate; 14: second substrate; 16: thermal image sensor; 31: range image sensor; 37: optical filter film; 41: light-receiving part (charge generation region); 42: charge collection region; 43: transfer electrode; R1: arrangement region of thermal image sensors; R2: arrangement region of range image sensors; S1, S2: seal body; W1: arrangement pitch of thermal image sensors; W2: arrangement pitch of range image sensors.

The invention claimed is:

1. A composite sensor comprising:
    a first substrate arranged with a thermal image sensor constituted by a plurality of thermoelectric elements; and
    a second substrate arranged with a range image sensor having a charge generation region for generating an electric charge in response to light incident thereon and a transfer electrode for transferring the electric charge generated in the charge generation region to a predetermined charge collection region according to a charge transfer signal given beforehand;
    wherein the second substrate is mounted on the first substrate such that a region arranged with the thermal image sensor and a region arranged with the range image sensor overlap each other as seen in the mounting direction; and
    wherein the first and second substrates are mounted on top of each other so as to form a seal body sealing a space about the thermal image sensor with the first substrate serving as a top plate.

2. A composite sensor according to claim 1, wherein the range image sensor in the second substrate has an arrangement pitch smaller than that of the thermal image sensor in the first substrate.

3. A composite sensor according to claim 1, wherein an optical filter film transparent to light in a mid-infrared region is formed on an inner wall surface of the seal body.

4. A composite sensor according to claim 1, wherein the seal body has a vacuum state therewithin.

5. A composite sensor module comprising:
    the composite sensor according to claim 1; and
    a lens arranged such as to have an imaging plane at the region arranged with the range image sensor in the second substrate.

* * * * *